United States Patent
Wang et al.

(10) Patent No.: US 6,448,171 B1
(45) Date of Patent: Sep. 10, 2002

(54) MICROELECTRONIC FABRICATION HAVING FORMED THEREIN TERMINAL ELECTRODE STRUCTURE PROVIDING ENHANCED PASSIVATION AND ENHANCED BONDABILITY

(75) Inventors: Tsing-Chow Wang; Te-Sung Wu, both of Cupertino, CA (US)

(73) Assignee: Aptos Corporation, Milpitas, CA (US)

( * ) Notice: Subject to any disclaimer, the term of this patent is extended or adjusted under 35 U.S.C. 154(b) by 0 days.

(21) Appl. No.: 09/565,962

(22) Filed: May 5, 2000

(51) Int. Cl.⁷ .................. H01L 21/44; H01L 21/4763
(52) U.S. Cl. .................. 438/614; 438/612; 438/613; 438/641; 438/674; 438/678
(58) Field of Search .................. 438/612–617, 438/637–641, 674, 678

(56) References Cited

U.S. PATENT DOCUMENTS

| | | | |
|---|---|---|---|
| 5,130,779 A | | 7/1992 | Agarwala et al. ............. 357/67 |
| 5,149,615 A | * | 9/1992 | Chakravorty et al. ........ 430/313 |
| 5,418,186 A | * | 5/1995 | Park et al. .................. 438/614 |
| 5,640,052 A | | 6/1997 | Tsukamoto .................. 257/781 |
| 5,665,639 A | * | 9/1997 | Seppala et al. .............. 438/15 |
| 5,719,449 A | | 2/1998 | Strauss ....................... 257/786 |
| 5,781,022 A | | 7/1998 | Wood et al. ................. 324/757 |

* cited by examiner

Primary Examiner—Ha Tran Nguyen
(74) Attorney, Agent, or Firm—Tung & Associates

(57) ABSTRACT

Within a method for fabricating a microelectronic fabrication, and a microelectronic fabrication fabricated employing the method, there is first provided a substrate. Within the method, there is then formed over the substrate a patterned bond pad layer. There is also formed over the substrate a patterned passivation layer which passivates a series of edges of the patterned bond pad layer while leaving exposed a central portion of the patterned bond pad layer, where the patterned passivation layer has a series of protrusions within the patterned passivation layer over the series of edges of the patterned bond pad layer. There is then formed over the central portion of the patterned bond pad layer and bridging over the series of protrusions of the patterned passivation layer a first terminal electrode layer having an upper surface which is concave. Finally, there is then formed over the first terminal electrode layer a second terminal electrode layer having an upper surface which is other than concave. The method otherwise contemplates the microelectronic fabrication fabricated employing the method. A terminal electrode structure which comprises the first terminal electrode layer and the second terminal electrode layer provides enhanced passivation of the microelectronic fabrication and enhanced bondability to the terminal electrode structure.

11 Claims, 1 Drawing Sheet

MICROELECTRONIC FABRICATION HAVING FORMED THEREIN TERMINAL ELECTRODE STRUCTURE PROVIDING ENHANCED PASSIVATION AND ENHANCED BONDABILITY

CROSS-REFERENCE TO RELATED APPLICATIONS

This application is related to: (1) co-assigned application Ser. No. 09/564,589, titled "Microelectronic Fabrication Having Formed Therein Terminal Electrode Structure Providing Enhanced Barrier Properties"; and (2) co-assigned application Ser. No. 09/565,541, titled "Method for Fabricating a Microelectronic Fabrication Having Formed Therein a Redistribution Structure," each of which related co-assigned applications is filed on an even date herewith, and the teachings of each of which related co-assigned applications is incorporated herein by reference.

BACKGROUND OF THE INVENTION

1. Field of the Invention

The present invention relates generally to microelectronic fabrications having formed therein terminal electrode structures. More particularly, the present invention relates to microelectronic fabrications having formed therein terminal electrode structures which provide enhanced passivation of the microelectronic fabrications and enhanced bondability to the terminal electrode structures.

2. Description of the Related Art

Microelectronic fabrications are formed from microelectronic substrates over which are formed patterned microelectronic conductor layers which are separated by microelectronic dielectric layers.

In conjunction with various means and configurations for interconnecting microelectronic fabrications of various varieties, it is common in the art of microelectronic fabrication to employ integral to individual microelectronic fabrications terminal electrode structures at locations within the individual microelectronic fabrications where the individual microelectronic fabrications are to be interconnected. Such terminal electrode structures are typically formed integral to the individual microelectronic fabrications while employing various metallurgy layers, which under certain circumstances may include solder interconnection layers, to which the various means and configurations for interconnecting the microelectronic fabrications may be connected.

While terminal electrode structures are thus desirable and clearly essential within the art of microelectronic fabrication for effectively providing electrical interconnections for various varieties of microelectronic fabrications which may be fabricated within the art of microelectronic fabrication, terminal electrode structures are nonetheless not entirely without problems in the art of microelectronic fabrication when fabricating microelectronic fabrications. In that regard, it is typically highly desirable within the art of microelectronic fabrication, but nonetheless not always readily achievable within the art of microelectronic fabrication, to provide within a microelectronic fabrication a terminal electrode structure which simultaneously provides enhanced passivation of microelectronic fabrication within which is formed the terminal electrode structure and enhanced bondability to the terminal electrode structure.

It is thus towards the goal of providing for use when fabricating a microelectronic fabrication a terminal electrode structure which simultaneously provides within the microelectronic fabrication an enhanced passivation of the microelectronic fabrication within which is formed the terminal electrode structure and enhanced bondability to the terminal electrode structure that the present invention is directed.

Various configurations and materials have been disclosed within the art of microelectronic fabrication for fabricating and testing, with desirable properties, terminal electrode structures within microelectronic fabrications.

For example, Agarwala et al., in U.S. Pat. No. 5,130,779, disclose: (1) a multi-layer solder layer terminal electrode structure with an enhanced aspect ratio for use within a microelectronic fabrication for directly interconnecting, with attenuated physical stress and strain, a pair of microelectronic substrates within the microelectronic fabrication; and (2) a method for forming the multi-layer solder layer terminal electrode structure with the enhanced aspect ratio for use within the microelectronic fabrication for directly interconnecting, with attenuated physical stress and strain, the pair of microelectronic substrates within the microelectronic fabrication. To realize the foregoing objects, the method for forming the multi-layer solder layer terminal electrode structure employs forming upon at least one terminal electrode solder layer employed within the multi-layer solder layer terminal electrode structure, prior to thermal reflow of the at least one terminal electrode solder layer: (1) a capping or encapsulant metal layer, or in the alternative; (2) a sidewall spacer layer, such that upon thermal reflow of the at least one terminal electrode solder layer the at least one terminal electrode solder layer is not susceptible to thermal reflow induced collapse.

In addition, Tsukamoto, in U.S. Pat. No. 5,640,052, discloses a terminal electrode structure for use when directly interconnecting a pair of microelectronic substrates within a microelectronic fabrication, where the terminal electrode structure provides for attenuated thermally induced physical stress and strain of the pair of microelectronic substrates with respect to the terminal electrode structure when directly interconnecting the pair of microelectronic substrates within the microelectronic fabrication while employing the terminal electrode structure. To realize the foregoing object, the terminal electrode structure employs a metal core layer having formed thereupon a solder terminal electrode layer which bridges to a pair of bond pads formed within the pair of microelectronic substrates, where the solder terminal electrode layer which bridges to the pair of bond pads formed within the pair of microelectronic substrates is formed with an hourglass shape.

Further, Strauss, in U.S. Pat. No. 5,719,449, disclose a flip chip integrated circuit microelectronic fabrication which employs therein a terminal electrode structure which provides for improved testability of the flip chip integrated circuit microelectronic fabrication. The flip chip integrated circuit microelectronic fabrication realizes the foregoing object by providing within the flip chip integrated circuit microelectronic fabrication a terminal metal layer which is fabricated to comprise a pair of interconnected bond pad layers, wherein: (1) one of the pair of interconnected bond pad layers serves as an electrical test bond pad layer terminal electrode structure within the flip chip integrated circuit microelectronic fabrication and has formed thereupon no additional metallurgy layers; and (2) a second of the pair of interconnected bond pad layers serves as an electrical interconnection bond pad layer and has formed thereupon a solder layer to provide an electrical interconnection terminal electrode structure within the flip chip integrated circuit microelectronic fabrication.

Finally, Wood et al., in U.S. Pat. No. 5,781,022, disclose an electrical test apparatus which provides for electrically testing an integrated circuit microelectronic fabrication die through contact of a probe which is integral to the electrical test apparatus with a bond pad terminal electrode structure which is integral to the integrated circuit microelectronic fabrication die, where neither the bond pad terminal electrode structure nor a passivation layer passivating a portion of the bond pad terminal electrode structure which is integral to the integrated circuit microelectronic fabrication die is damaged incident to electrically testing the integrated circuit microelectronic fabrication die with the electrical test apparatus. In order to realize the foregoing result, the electrical test apparatus employs the probe which comprises a nominally flat but nonetheless ridged probe surface which contacts the bond pad terminal electrode structure within the integrated circuit microelectronic fabrication die.

Desirable for use when fabricating microelectronic fabrications are additional terminal electrode structures which simultaneously provide within a microelectronic fabrication enhanced passivation of a microelectronic fabrication within which is formed the terminal electrode structure and enhanced bondability to the terminal electrode structure.

It is towards the foregoing objects that the present invention is directed.

SUMMARY OF THE INVENTION

A first object of the present invention is to provide a terminal electrode structure for use within a microelectronic fabrication, and a method for fabricating the terminal electrode structure for use within the microelectronic fabrication.

A second object of the present invention is to provide the terminal electrode structure and the method for fabricating the terminal electrode structure in accord with the first object of the present invention, wherein the terminal electrode structure provides enhanced passivation of the microelectronic fabrication within which is formed the terminal electrode structure and enhanced bondability to the terminal electrode structure.

A third object of the present invention is to provide the method for forming the terminal electrode structure in accord with the first object of the invention and the second object of the invention, which method is readily commercially implemented.

In accord with the objects of the present invention, there is provided by the present invention a terminal electrode structure for use when fabricating a microelectronic fabrication, and a method for fabricating the terminal electrode structure for use when fabricating the microelectronic fabrication.. To practice the method of the present invention, there is first provided a substrate. There is then formed over the substrate a patterned bond pad layer. There is also formed over the substrate a patterned passivation layer which passivates a series of edges of the patterned bond pad layer while leaving exposed a central portion of the patterned bond pad layer, where the patterned passivation layer has a series of protrusions within the patterned passivation layer over the series of edges of the patterned bond pad layer. There is then formed over the central portion of the patterned bond pad layer and bridging over the series of protrusions of the patterned passivation layer a first terminal electrode layer having an upper surface which is concave. Finally, there is then formed over the first terminal electrode layer a second terminal electrode layer having an upper surface which is other than concave, and preferably planar.

The method for fabricating the terminal electrode structure in accord with the present invention contemplates the terminal electrode structure fabricated in accord with the method for fabricating the terminal electrode structure in accord with the present invention.

The present invention provides a terminal electrode structure for use when fabricating a microelectronic fabrication, and a method for fabricating the terminal electrode structure for use when fabricating the microelectronic fabrication, wherein the terminal electrode structure provides enhanced passivation of the microelectronic fabrication within which is formed the terminal electrode structure and enhanced bondability to the terminal electrode structure. The present invention realizes the foregoing objects by employing when fabricating a terminal electrode structure within the microelectronic fabrication in accord with the present invention formed over a patterned bond pad layer the edges of which are passivated by a patterned passivation layer which in turn has a series of protrusions over the series of edges of the patterned bond pad layer a terminal electrode structure which comprises: (1) a first terminal electrode layer which is formed over the patterned bond pad layer within the microelectronic fabrication and bridging over the series of protrusion of the patterned dielectric passivation layer which passivates the series of edges of the patterned bond pad layer (to provide the enhanced passivation of the microelectronic fabrication), where the first terminal electrode layer has an upper surface which is concave; and (2) a second terminal electrode layer formed over the first terminal electrode layer, where the second terminal electrode layer has an upper surface which is other than concave, and preferably planar (to provide enhanced bondability to the terminal electrode structure).

The method of the present invention is readily commercially implemented. As will be clear, and as is illustrated within the Description of the Preferred Embodiment which follows, the present invention employs methods and materials as are otherwise generally known in the art of microelectronic fabrication, but employed within the context of specific process controls and process limitations to provide the present invention. Since it is a materials selection and process control which thus provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a terminal electrode structure for use when fabricating a microelectronic fabrication, and a method for fabricating the terminal electrode structure for use when fabricating the microelectronic fabrication, where the terminal electrode structure provides enhanced passivation of the microelectronic fabrication within which is fabricated the terminal electrode structure and enhanced bondability to the terminal electrode structure. The present invention realizes the foregoing objects by employing when fabricating a terminal electrode structure within a microelectronic fabrication in accord with the present invention formed over a patterned bond pad layer the edges of which are passivated by a patterned passivation layer having a series of protrusions over the series of edges of the patterned bond pad layer a terminal electrode structure which comprises: (1) a first terminal electrode layer which is formed over the patterned bond pad layer within the microelectronic fabrication and bridging over the series of protrusion of the patterned dielectric passivation layer which passivates the series of edges of the patterned bond pad layer (to provide the enhanced passivation of the microelectronic fabrication), where the first terminal electrode layer has an upper surface which is concave; and (2) a second terminal electrode layer formed over the first terminal electrode layer, where the second terminal electrode layer has an upper surface which is other than concave, and preferably planar (to provide enhanced bondability to the terminal electrode structure).

Although the present invention provides particular value when forming a terminal electrode structure for use when fabricating a semiconductor integrated circuit microelectronic fabrication, the present invention may be employed for forming terminal electrode structures for use when fabricating microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 1:
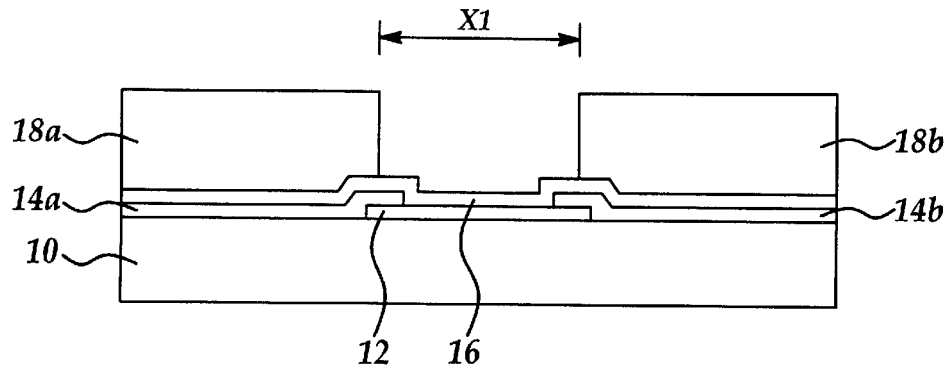
FIG. 1, FIG. 2, FIG. 3 and FIG. 4 show a series of schematic cross-sectional diagrams illustrating the results of forming, in accord with a preferred embodiment of the present invention, a microelectronic fabrication having formed therein a terminal electrode structure in accord with the present invention.

Referring now to FIG. 1 to FIG. 4, there is shown a series of schematic cross-sectional diagrams illustrating the results of progressive stages in fabricating within a microelectronic fabrication in accord with a preferred embodiment of the present invention a terminal electrode structure in accord with the present invention. Shown in FIG. 1 is a schematic cross-sectional of the microelectronic fabrication at an early stage in its fabrication in accord with the preferred embodiment of the present invention.

Shown in FIG. 1, in a first instance, is a substrate 10 having formed thereover a patterned bond pad layer 12.

Within the preferred embodiment of the present invention with respect to the substrate 10, and although, as noted above, the present invention provides particular value when employed in fabricating a terminal electrode structure within a semiconductor integrated circuit microelectronic fabrication, the substrate 10 may be employed when fabricating a microelectronic fabrication selected from the group including but not limited to integrated circuit microelectronic fabrications, ceramic substrate microelectronic -fabrications, solar cell optoelectronic microelectronic fabrications, sensor image array optoelectronic microelectronic fabrications and display image array optoelectronic microelectronic fabrications.

Similarly, although not specifically illustrated within the schematic cross-sectional diagram of FIG. 1, the substrate 10 may consist of the substrate alone as employed within the microelectronic fabrication within which is employed the substrate 10, or in the alternative, the substrate 10 may comprise the substrate as employed within the microelectronic fabrication, where the substrate has formed thereupon and/or thereover any of several additional microelectronic layers as are conventionally employed within the microelectronic fabrication within which is employed the substrate 10. Similarly with the substrate alone as employed within the microelectronic fabrication, such additional microelectronic layers may be formed of microelectronic materials including but not limited to microelectronic conductor materials, microelectronic semiconductor materials and microelectronic dielectric materials.

Similarly, and although also not specifically illustrated within the schematic cross-sectional diagram of FIG. 1, the substrate 10, typically and preferably, although not exclusively, when the substrate 10 comprises a semiconductor substrate employed within a semiconductor integrated circuit microelectronic fabrication, has formed therein and/or thereupon microelectronic devices as are conventional within the microelectronic fabrication within which is employed the substrate 10. Such microelectronic devices may include, but are not limited to, resistors, transistors, diodes and capacitors.

Most typically and preferably, within the preferred embodiment of the present invention, the substrate 10 comprises a semiconductor substrate having formed therein and/or thereupon various microelectronic devices, wherein the semiconductor substrate also has formed thereupon and/or thereover several microelectronic layers which include but are not limited to the patterned bond pad layer 12.

Within the preferred embodiment of the present invention with respect to the patterned bond pad layer 12, the patterned bond pad layer 12 may be formed of bond pad materials as are conventional within the microelectronic fabrication within which is employed the patterned bond pad layer 12, such bond pad materials being selected from the group including but not limited to aluminum, aluminum alloy, copper and copper alloy bond pad materials. Typically and preferably, the patterned bond pad layer 12 may be formed from any of the foregoing bond pad materials, formed to a thickness of from about 6000 to about 12000 angstroms while being patterned to form the patterned bond pad layer 12 of bidirectional linewidth from about 40 to about 120 microns.

Shown also within the schematic cross-sectional diagram of FIG. 1, and also formed over the substrate 10 and passivating a pair of edges of the patterned bond pad layer 12 is a pair of patterned dielectric passivation layers 14a and 14b, where each of the pair of patterned dielectric passivation layers 14a and 14b has formed therein a protrusion within each of the pair of patterned dielectric passivation layers 14a and 14b at a location where each of the pair of patterned dielectric passivation layers 14a and 14b passivates a corresponding edge of the patterned bond pad layer 12, and while similarly each of the pair of. patterned dielectric passivation layers 14a and 14b does not cover a central portion of the patterned bond pad layer 12. While the schematic cross-sectional diagram of FIG. 1 illustrates this feature of the pair of patterned dielectric passivation layers 14a and 14b incident to a cross-section through the microelectronic fabrication as illustrated within the schematic diagram of FIG. 1, it is nonetheless understood by a person skilled in the art that the pair of patterned dielectric passivation layers 14a and 14b is intended as illustrative of portions of a single patterned passivation dielectric layer which uniformly passivates all of the edges of the patterned bond pad layer 12 while leaving exposed the central portion of the patterned bond pad layer 12.

Within the preferred embodiment of the present invention, the pair of patterned dielectric passivation layers 14a and 14b may be formed of passivation dielectric materials as are conventional in the art of microelectronic fabrication, such passivation dielectric materials being selected from the group including but not limited to silicon oxide passivation dielectric materials, silicon nitride passivation dielectric materials, silicon oxynitride passivation dielectric materials, laminates thereof and composites thereof. Typically and preferably, the pair of patterned dielectric passivation layers 14a and 14b is formed at least in part of a silicon nitride dielectric passivation material, formed to a thickness of from about 8000 to about 12000 angstroms passivating the pair of opposite edges of the patterned bond pad layer 12 while leaving exposed the central portion of the patterned bond pad layer 12. Typically and preferably, each of the pair of patterned dielectric passivation layers 14a and 14b overlaps the patterned bond pad layer 12 by a distance of from about 6 to about 16 microns in order to provide optimal passivation of the edges of the patterned bond pad layer 12.

Shown also within the schematic cross-sectional diagram of FIG. 1 is a blanket barrier layer 16 formed upon the pair of patterned dielectric passivation layers 14a and 14b and extending over and upon the exposed central portion of the patterned bond pad layer 12.

Within the preferred embodiment of the present invention with respect to the blanket barrier layer 16, the blanket barrier layer 16 is typically and preferably formed of a barrier material which provides for inhibited interdiffusion of each of: (1) the bond pad material from which is formed the patterned bond pad layer 12; and (2) the dielectric passivation material from which is formed the pair of patterned dielectric passivation layers 14a and 14b; with (3) a terminal electrode material which is employed for forming a terminal electrode layer which is subsequently formed contacting the blanket barrier layer 16.

Although such barrier materials may include but are not limited to various refractory metal barrier materials (i.e., titanium, tungsten, and molybdenum refractory metal barrier materials) and alloys thereof, for the preferred embodiment of the present invention the blanket barrier layer 16 is typically and preferably formed of a stack of layers comprising: (1) a blanket first titanium-tungsten alloy barrier material layer of thickness about 450 to about 550 angstroms, having formed thereupon; (2) a blanket titanium-tungsten alloy nitride barrier material layer of thickness about 2700 to about 3300 angstroms, in turn having formed thereupon; (3) a blanket second titanium-tungsten alloy barrier material layer of thickness about 900 to about 1100 angstroms. Each of the foregoing three layers may be formed employing methods as are conventional in the art of microelectronic fabrication, including but not limited to chemical vapor deposition (CVD) methods, thermally assisted evaporation methods and physical vapor deposition (PVD) sputtering methods. Such a tri-layer barrier layer is described in greater detail within a related co-assigned application Ser. No. 09/564,589, filed on an even date herewith, and titled "Microelectronic Fabrication Having Formed Therein Terminal Electrode Structure Providing Enhanced Barrier Properties," the teachings of which are incorporated herein fully by reference.

Similarly, although not specifically illustrated within the schematic cross-sectional diagram of FIG. 1, within the context of the preferred embodiment of the present invention the blanket barrier layer 16 typically and preferably also has formed thereupon a blanket seed layer, typically and preferably, but not exclusively formed of a precious metal, such as but not limited to gold or a gold alloy, formed to a thickness of from about 900 to about 1100 angstroms, wherein the blanket seed layer provides for enhanced plating characteristics with respect to an electroplating method employed in further fabrication of the microelectronic fabrication whose schematic cross-sectional diagram is illustrated in FIG. 1.

Finally, there is also shown within the schematic cross-sectional diagram of FIG. 1 a pair of patterned first photoresist layers 18a and 18b formed over the blanket barrier layer 16 which within the context of the preferred embodiment of the present invention has formed thereupon the blanket seed layer which is not specifically illustrated within the schematic cross-sectional diagram of FIG. 1.

Within the preferred embodiment of the present invention with respect to the pair of patterned first photoresist layers 18a and 18b, the pair of patterned first photoresist layers 18a and 18b may be formed employing methods and photoresist materials as are conventional in the art of microelectronic fabrication, such photoresist materials being selected from the general groups of photoresist materials including but not limited to positive photoresist materials and negative photoresist materials. Typically and preferably, each of the pair of patterned first photoresist layers 18a and 18b is formed to a thickness of from about 10 to about 20 microns to define a first aperture of bidirectional first aperture width X1 from about 36 to about 110 microns. Within the preferred embodiment of the present invention, the first aperture of bidirectional first aperture width X1 of from about 36 to about 110 microns is sized such that there is provided enhanced and optimized passivation over the pair of patterned dielectric passivation layers 14a and 14b of a patterned first terminal electrode layer subsequently formed into the first aperture of the bidirectional first aperture width X1 of from about 36 to about 110 microns.

Figure 2:
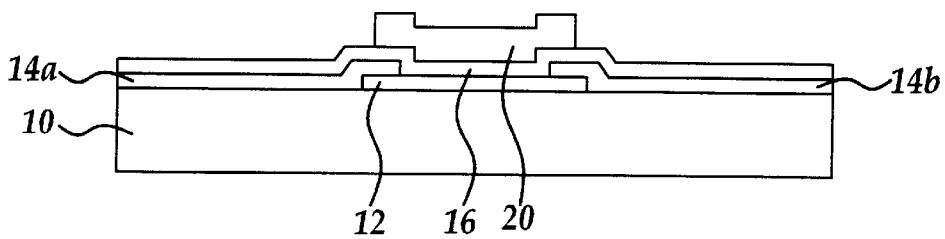

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein: (1) there has been formed within the first aperture defined by the pair of patterned first photoresist layers 18a and 18b a patterned first terminal electrode layer 20; and (2) the pair of patterned first photoresist layers 18a and 18b has then been stripped from the microelectronic fabrication.

Within the preferred embodiment of the present invention, the patterned first terminal electrode layer 20 is preferably formed employing a plating method, although methods other than plating methods may also be employed for forming within the context of the present invention a patterned first terminal electrode layer which is functionally equivalent to the patterned first terminal electrode layer 20. As is illustrated within the schematic cross-sectional diagram of FIG. 1, the patterned first terminal electrode layer 20 is formed with a pair of protrusions over the pair of patterned dielectric passivation layers 14a and 14b, and thus the patterned first terminal electrode layer 20 is formed with an upper surface which is concave. Such a concave surface of the patterned first terminal electrode layer 20 is often undesirable within the art of microelectronic fabrication since such a concavity may compromise bondability to the patterned first terminal electrode layer 20 by providing for voids when bonding a bond material to the patterned first terminal electrode layer 20.

Within the preferred embodiment of the present invention, the patterned first terminal electrode layer 20 overlaps each of the patterned dielectric passivation layers 14a and 14b by about 5 to about 11 microns. Similarly, within the preferred embodiment of the present invention the patterned first terminal electrode layer 20 is formed of a gold or a gold alloy terminal electrode material, although other terminal electrode materials, including but not limited to nickel, nickel alloy, other precious metal and other precious metal alloy terminal electrode materials may also be employed when forming the patterned first terminal electrode layer 20. Typically and preferably the patterned first terminal electrode layer 20 is formed to a thickness of from about 2 to about 7 microns, and more preferably from about 2 to about 4 microns, while preferably employing the plating method.

When employing the preferred plating method for forming the patterned first terminal electrode layer 20 when formed of a gold terminal electrode material, the plating method also employs, in conjunction with an ionic gold source: (1) a thallium aqueous concentration of from about 20 to about 80 parts per million (ppm); (2) a pH of from about 9.2 to about 9.8; (3) a plating temperature of from about 47 to about 53 degrees centigrade; and (4) a plating current density of from about 3 to about 4 amps per square foot.

With respect to stripping from the microelectronic fabrication whose schematic cross-sectional diagram is illustrated in FIG. 1 the pair of patterned first photoresist layers 18a and 18b to provide in part the microelectronic fabrication whose schematic cross-sectional diagram is illustrated in FIG. 2, the pair of patterned first photoresist layers 18a and 18b may be stripped from the microelectronic fabrication whose schematic cross-sectional diagram is illustrated in FIG. 1 to provide in part the microelectronic fabrication whose schematic cross-sectional diagram is illustrated in FIG. 2 while employing photoresist stripping methods as are conventional in the art of microelectronic fabrication. Such photoresist stripping methods may be selected from the group including but not limited to wet chemical photoresist stripping methods, dry plasma photoresist stripping methods and combinations of wet chemical photoresist stripping methods and dry plasma photoresist stripping methods, provided, within the context of the preferred embodiment of the present invention, that the photoresist stripping method which is employed for stripping the pair of patterned first photoresist layers 18a and 18b does not dissolve the blanket seed layer which is formed upon the blanket barrier layer 16.

Figure 3:
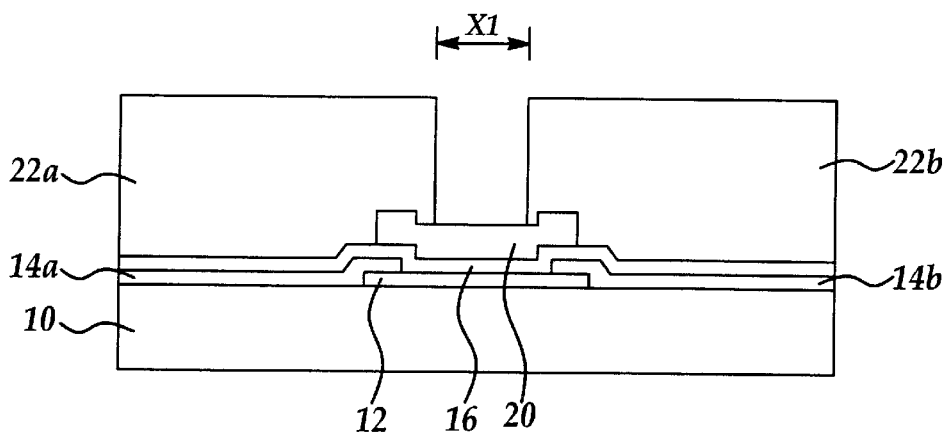

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein there is formed over the microelectronic fabrication and leaving exposed only a portion of the patterned first terminal electrode layer 20 a pair of patterned second photoresist layers 22a and 22b.

Within the preferred embodiment of the present invention, the pair of patterned second photoresist layers 22a and 22b is typically and preferably formed employing methods and photoresist materials as are otherwise generally equivalent to the methods and photoresist materials as are employed for forming the pair of patterned first photoresist layers 18a and 18b as is illustrated within the schematic cross-sectional diagram of FIG. 1, but wherein the pair of patterned second photoresist layers 22a and 22b defines a second aperture of second aperture width X2, wherein the second aperture of second aperture width X2 is of minimally sufficient aperture width such that a patterned second terminal electrode layer formed within the second aperture defined by the pair of patterned second photoresist layers 22a and 22b is formed at minimum with a non-concave top surface of the patterned second terminal electrode layer and more preferably with a planar top surface of the patterned second terminal electrode layer. Within the context of registration tolerances of photoexposure apparatus typically employed when forming the pair of patterned first photoresist layers 18a and 18b as illustrated within the schematic cross-sectional diagram of FIG. 1 and the pair of patterned second photoresist layers 22a and 22b as illustrated within the schematic cross-sectional diagram of FIG. 3, along with the linewidth of the patterned bond pad layer 12 and the overlap thereupon of the pair of patterned dielectric passivation layers 14a and 14b, the second aperture width X2 of the second aperture as defined by the pair of patterned second photoresist layers 22a and 22b is typically and preferably from about 10 to about 84 microns. Similarly, each of the pair of patterned second photoresist layers 22a and 22b is formed to a thickness of from about 25 to about 55 microns, and more preferably from about 45 to about 55 microns.

Figure 4:
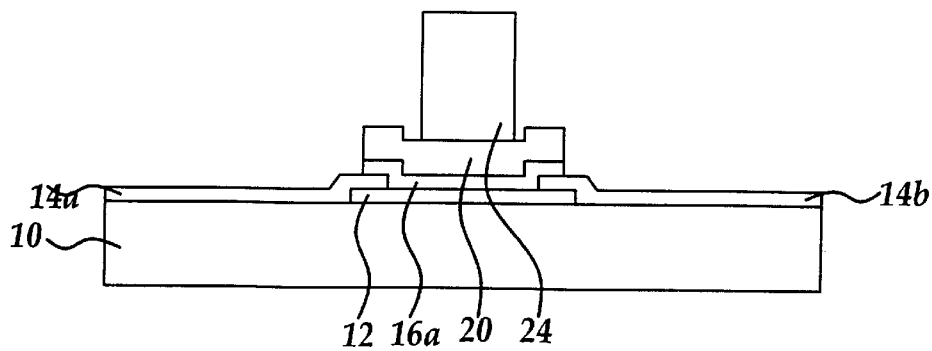

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein: (1) there has been formed a patterned second terminal electrode layer 24 upon the patterned first terminal electrode layer 20; (2) the pair of patterned second photoresist layers 22a and 22b has been stripped from the microelectronic fabrication; and (3) the blanket barrier layer 16 (and the blanket seed layer formed thereupon) has been etched to form a patterned barrier layer 16a (and a patterned seed layer formed thereupon) a really co-extensive with the patterned first terminal electrode layer 20.

Within the preferred embodiment of the present invention, the patterned second terminal electrode layer 24 is typically and preferably formed employing a plating method analogous or equivalent to the plating method which is employed for forming the patterned first terminal electrode layer 20. The plating method may employ the same seed layer as may be employed for forming the patterned first terminal electrode layer 20. Typically and preferably, the patterned second terminal electrode layer 24 is formed of a thickness from about 20 to about 50 microns, and more preferably from about 42 to about 48 microns, while having a bidirectional linewidth of from about 10 to about 84 microns as defined by the second aperture width X2 of the second aperture as defined by the pair of patterned second photoresist layers 22a and 22b. While the preferred embodiment of the present invention illustrates the patterned second terminal electrode layer 24 as being narrower than the patterned first terminal electrode layer 20, such is not absolutely required within the present invention provided the a patterned second terminal electrode layer analogous to the patterned second terminal electrode layer 24 has a top surface that is other than concave.

Similarly, within the preferred embodiment of the present invention, the pair of patterned second photoresist layers 22a and 22b may be stripped from the microelectronic fabrication whose schematic cross-sectional diagram is illustrated in FIG. 3 to provide in part the microelectronic fabrication whose schematic cross-sectional diagram is illustrated in FIG. 4 while employing photoresist stripping methods as are conventional in the art of microelectronic fabrication, and as are employed for stripping from the microelectronic fabrication whose schematic cross-sectional diagram is illustrated in FIG. 1 the pair of patterned first photoresist layers 18a and 18b to provide in part the microelectronic fabrication whose schematic cross-sectional diagram is illustrated in FIG. 2.

Finally, with respect to forming from the blanket barrier layer 16 (and the blanket seed layer formed thereupon) the corresponding patterned barrier layer 16a (and the corresponding patterned seed layer formed thereupon) such patterning may be accomplished employing wet chemical etch methods or dry plasma etch methods as are otherwise generally conventional in the art of microelectronic fabrication, although with either wet chemical etch methods or dry plasma etch methods there will be generally be lost a minimal and negligible thickness of the patterned second terminal electrode layer 24 and the patterned first terminal electrode layer 20 when formed of a gold or gold alloy terminal conductor material when etching the blanket seed layer when also formed of a gold or gold alloy seed material.

Within the preferred embodiment of the present invention, the blanket seed layer when formed of a gold or gold alloy seed material is typically and preferably etched to form the patterned seed layer while employing an aqueous potassium iodide (1.5 pounds per gallon) etchant at room temperature. Similarly, within the preferred embodiment of the present invention, the blanket barrier layer 16 when formed of the titanium-tungsten alloy/titanium-tungsten alloy nitride/titanium-tungsten alloy laminate is preferably etched to form the patterned barrier layer 16a while employing an aqueous 30 percent hydrogen peroxide etchant at a temperature of about 70 degrees centigrade.

Although not specifically illustrated within the schematic cross-sectional diagram of FIG. 4, the microelectronic fabrication whose schematic cross-sectional diagram is illustrated within FIG. 4 is typically and preferably thermally annealed in order to provide optimal metallurgic properties, and in particular hardness, to at least the patterned first terminal electrode layer 20 and the patterned second terminal electrode layer 24. Such thermal annealing is typically and preferably undertaken within a nitrogen atmosphere, at a flow rate of about 7.5 cubic feet per minute (cfm) and a temperature of from about 295 to about 305 degrees centigrade for a time period of from about 10 to about 20 minutes, to provide both the patterned first terminal electrode layer 20 and the patterned second terminal electrode layer 24, each when formed of an electroplated gold terminal electrode material, of a hardness from about 35 to about 65 Vickers at 10 grams force.

Upon forming the microelectronic fabrication whose schematic cross-sectional diagram is illustrated in FIG. 4, there is formed a microelectronic fabrication having formed therein a terminal electrode structure which provides for both enhanced passivation of the microelectronic fabrication within which is formed the terminal electrode structure and enhanced bondability to the terminal electrode structure. The terminal electrode structure of the present invention realizes the foregoing object by employing within the terminal electrode structure: (1) a patterned first terminal electrode layer which is of a minimally sufficient linewidth to fully passivate a series of protrusions of a patterned passivation dielectric layer in turn formed over a series of edges of a patterned bond pad layer but not over a central portion of the patterned bond pad layer, where the patterned first terminal electrode layer has an upper surface which is concave; and (2) a patterned second terminal electrode layer formed over, and preferably upon, the patterned first terminal electrode layer, where the patterned second terminal electrode layer is formed with an upper surface which is other than concave, and preferably planar.

As is understood by a person skilled in the art, the preferred embodiment of the present invention is illustrative of the present invention rather than limiting of the present invention. Revisions and modifications may be made to methods, materials, structures and dimensions through which may be provided within a microelectronic fabrication a terminal electrode structure in accord with the preferred embodiment of the present invention, while still providing a terminal electrode structure within a microelectronic fabrication in accord with the present invention, further in accord with the appended claims.

What is claimed is:

1. A method for fabricating a microelectronic fabrication comprising:
   providing a substrate;
   forming over the substrate a patterned bond pad layer;
   forming over the substrate and the patterned bond pad layer a patterned passivation layer which passivates a series of edges of the patterned bond pad layer while leaving exposed a central portion of the patterned bond pad layer, the patterned passivation layer having a series of protrusions within the patterned passivation layer over the series of edges of the patterned bond pad layer;
   selectively forming upon the central portion of the patterned bond pad layer and bridging over the series of protrusions of the patterned passivation layer a patterned first terminal electrode layer having an upper surface which is concave; and
   selectively forming directly forming upon the patterned first terminal electrode layer a patterned second terminal electrode layer having an upper surface which is other than concave;
   Wherein the patterned first terminal electrode layer has a first linewidth greater than a second linewidth of the patterned second terminal electrode layer.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the patterned bond pad layer is formed from a bond pad material selected from the group consisting of aluminum, aluminum alloys, copper and copper alloys.

4. The method of claim 1 wherein the patterned passivation layer is formed from a passivation material selected from the group consisting of silicon oxide dielectric materials, silicon nitride dielectric materials, silicon oxynitride dielectric materials, laminates thereof and composites thereof.

5. The method of claim 1 wherein the patterned first terminal electrode layer is formed from a material selected from the group consisting of gold, gold alloys, nickel, nickel alloys, other precious metals and other precious metal alloys.

6. The method of claim 1 wherein the patterned second terminal electrode layer is formed from a material selected from the group consisting of gold, gold alloys, nickel, nickel alloys, other precious metals and other precious metal alloys.

7. The method of claim 1 wherein the patterned first terminal electrode layer is formed of a linewidth minimally sufficient to passivate the series of protrusions of the patterned passivation layer.

8. The method of claim 1 wherein the patterned second terminal electrode layer is formed of a linewidth minimally sufficient to form the second terminal electrode layer with the other than concave surface when forming the second terminal electrode layer upon the first terminal electrode layer.

9. The method of claim 1 wherein the surface of the patterned second terminal electrode layer is planar.

10. The method of claim 1 wherein:

the patterned first terminal electrode layer is formed employing a first plating method;

the patterned second terminal electrode layer is formed employing a second plating method; and the first plating method and the second plating method employ a single seed layer.

11. The method of claim 1 further comprising forming a barrier layer over the substrate, wherein:

the barrier layer is formed over the patterned passivation layer and interposed between the patterned bond pad layer and the patterned first terminal electrode layer; and the barrier layer is formed of a tri-layer stack comprising:

a first titanium-tungsten alloy layer;

a titanium-tungsten alloy nitride layer formed upon the first titanium-tungsten alloy layer; and a second titanium-tungsten alloy layer formed upon the titanium-tungsten alloy nitride layer.

\* \* \* \* \*